US010950742B2

(12) United States Patent
Lee et al.

(10) Patent No.: US 10,950,742 B2
(45) Date of Patent: Mar. 16, 2021

(54) METHOD FOR PREPARING A COMPOUND-BASED FILM FOR USE IN A SOLAR CELL BY PHOTO-ELECTRODEPOSITION

(71) Applicant: KOREA INSTITUTE OF SCIENCE AND TECHNOLOGY, Seoul (KR)

(72) Inventors: Doh Kwon Lee, Seoul (KR); In Ho Kim, Seoul (KR); Hee Sun Yun, Seoul (KR); Jang Mi Lee, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 16/343,807

(22) PCT Filed: Nov. 1, 2017

(86) PCT No.: PCT/KR2017/012213
§ 371 (c)(1),
(2) Date: Apr. 22, 2019

(87) PCT Pub. No.: WO2019/054556
PCT Pub. Date: Mar. 21, 2019

(65) Prior Publication Data
US 2019/0267502 A1    Aug. 29, 2019

(30) Foreign Application Priority Data

Sep. 12, 2017 (KR) .......................... 10-2017-0116757

(51) Int. Cl.
*C25D 3/56* (2006.01)
*C25D 5/50* (2006.01)
(Continued)

(52) U.S. Cl.
CPC ............ *H01L 31/0445* (2014.12); *C25D 3/56* (2013.01); *C25D 5/011* (2020.08); *C25D 5/02* (2013.01);
(Continued)

(58) Field of Classification Search
CPC ........ C25D 5/024; C25D 5/006; C25D 5/011; C25D 7/126
(Continued)

(56) References Cited

U.S. PATENT DOCUMENTS 4,507,181 A * 3/1985 Nath .................. C25D 7/126
205/91
2009/0139868 A1* 6/2009 Shrader .................. H01L 24/02
205/118

(Continued)

FOREIGN PATENT DOCUMENTS

JP      2010-129641 A    6/2010
KR  10-2012-0008390 A    1/2012
(Continued)

*Primary Examiner* — Brian W Cohen
(74) *Attorney, Agent, or Firm* — Rabin & Berdo, P.C.

(57) ABSTRACT

A method for preparing a film of a CIS semiconductor compound overcoated by a color layer includes preparing an electrolyte solution by mixing precursors of film constituents including Cu, In, and Se with a solvent; configuring an electrodeposition circuit by connecting an electrochemical cell comprising the electrolyte solution, a working electrode, and a counter electrode to a voltage or current supply device; disposing a photomask having the predetermined pattern on the working electrode; producing the film through the photomask on a surface of the working electrode by applying a reduction voltage or current; disposing a light source to emit light toward the photomask; and photoelectrically depositing the film on the surface of the working electrode at least in the predetermined pattern while illuminating light through the photomask; and forming a color layer of CuSe at least in (Continued)

the predetermined pattern on the film employed as a working electrode using photo-electrodeposition.

8 Claims, 11 Drawing Sheets

(51) Int. Cl.
    *C25D 5/48*     (2006.01)
    *C25D 5/02*     (2006.01)
    *C25D 5/00*     (2006.01)
    *C25D 5/10*     (2006.01)
    *H01L 31/0445*     (2014.01)
    *H01L 31/0392*     (2006.01)
    *H01L 31/18*     (2006.01)

(52) U.S. Cl.
    CPC ............... *C25D 5/022* (2013.01); *C25D 5/10* (2013.01); *C25D 5/48* (2013.01); *C25D 5/50* (2013.01); *H01L 31/0392* (2013.01); *H01L 31/03923* (2013.01); *H01L 31/18* (2013.01)

(58) Field of Classification Search
    USPC .......................................................... 205/91
    See application file for complete search history.

(56) References Cited

U.S. PATENT DOCUMENTS

| | | | | |
|---|---|---|---|---|
| 2010/0140098 | A1* | 6/2010 | Uzoh | C25D 3/54 205/96 |
| 2011/0011745 | A1* | 1/2011 | Ji | H01L 31/022425 205/91 |
| 2011/0132764 | A1* | 6/2011 | Lincot | C25D 7/08 205/91 |
| 2011/0278172 | A1* | 11/2011 | Cotte | C23C 18/143 205/91 |
| 2012/0015279 | A1 | 1/2012 | Son et al. | |
| 2014/0020736 | A1* | 1/2014 | Lee | H01L 31/04 136/252 |
| 2015/0243831 | A1* | 8/2015 | Deligianni | C25D 5/10 205/91 |

FOREIGN PATENT DOCUMENTS

| | | |
|---|---|---|
| KR | 10-2014-0015087 A | 2/2014 |
| KR | 10-1370637 B1 | 3/2014 |
| KR | 10-1644788 B1 | 8/2016 |

\* cited by examiner

The present invention relates to a method for preparing a compound thin film, a compound thin film prepared therefrom, and a solar cell including the compound thin film, and more particularly, to a method for preparing a compound thin film with a specific pattern provided on the surface thereof by using a photoelectrochemical deposition method or a photo-electrodeposition method, a compound thin film prepared therefrom, and a solar cell including the compound thin film.

BACKGROUND ART

As interest in environmental pollution issues and global warming caused by greenhouse gases in line with the Climate Change Convention has been increased, interest in a solar cell as an eco-friendly energy source has been increasing. Solar cells are classified into silicon solar cells, compound thin-film solar cells, organic or hybrid solar cells, and the like according to the type of light-absorbing layer.

Although the silicon solar cell is positioned first in the current global solar cell market, in an environment in which territorial area is limited as in Korea, there is a desperate need for developing a solar cell in the form that can be utilized even in a densely populated city center. This is because the application of the silicon solar cell to buildings, automobiles, mobile electronic devices, and the like is extremely limited due to the heavy weight and opaqueness of the silicon solar cell and the inherent monotonous and crude appearance of crystalline silicon.

Meanwhile, since a thin-film solar cell consists of thin films, it may exhibit a lightweight and flexible form, and thus interest and investment in a thin-film solar cell whose application field can be drastically expanded have been gradually increasing.

A compound-based thin-film solar cell (hereinafter, referred to as a compound thin-film solar cell) typified by copper indium selenide ($CuInSe_2$, CIS), copper indium gallium selenide ($Cu(In_{1-x}Ga_x)Se_2$, CIGS), or copper zinc tin sulfide ($Cu_2ZnSnS_4$, CZTS) has advantages in that the compound-based thin-film solar cell may be manufactured to be lightweight and flexible while having a higher photoelectric conversion efficiency than a polycrystalline silicon solar cell and being chemically, optically, and electrically more stable than an organic-based solar cell. Accordingly, the compound thin-film solar cell has been in the limelight as a next-generation solar cell whose application can be expanded to a field to which the silicon solar cell is not applicable, such as the field of window-type solar cells, curved solar cells, or the like.

However, the market share of the compound thin-film solar cell has not increased as much as previously expected, and one of the reasons that may explain this is that manufacturing costs of the silicon solar cell have been lowered by a greater margin than expected over the past several years. Accordingly, it is high time to suggest an applied product actively utilizing features of a compound thin-film solar cell that the conventional silicon solar cell does not have for the successful entry of a compound thin-film solar cell and for a groundbreaking development in the total solar cell market and renewable energy supply.

As one of such endeavors, an attempt to enhance consumer acceptance and maximize the added value of a compound thin-film solar cell by imparting aesthetically pleasing characteristics and design to a compound thin-film solar cell has drawn attention. A compound solar cell to which an aesthetic element is added may create various application fields. When the compound thin-film solar cell to which an aesthetic element is added is applied, among the various new application fields, to an urban solar power generation implemented by applying thin-film solar cells to a building's outer walls and windows, automotive glass and chassis, mobile electronic devices, and the like, it is thought that the compound thin-film solar cell market can achieve much faster growth than the silicon solar cell-led market.

Until now, as a solar cell which has been judged to be able to be spiced up with design elements, a dye-sensitized solar cell (DSSC) may be a representative example. In the dye-sensitized solar cell, the amount of dye adsorbed varies depending on the presence or absence of a $TiO_2$ layer applied for adsorption of the dye, and as a result, a pattern consisting of bright and dark areas may be realized on the surface of the dye-sensitized solar cell.

When a $TiO_2$ layer is coated using a method such as spin coating, screen printing, spraying, and electrospinning, the $TiO_2$ layer may be patterned by placing a screen or mask having a desired pattern on a substrate. In principle, this method can also be applied to the deposition of a light-absorbing layer by a sputtering method or a vacuum evaporation method.

However, the aforementioned methods have a problem in that a light-absorbing layer material coated or deposited on a screen or mask is discarded, and thus material utilization is significantly reduced, which is ultimately responsible for an increase in costs of the solar cell. Further, since the solar power generation cannot be performed in an area in which the light-absorbing layer is not coated (inactive region or dead area), the light-absorbing area is decreased due to patterning, and accordingly, the output power of the solar cell per unit area is reduced.

In contrast, if a compound-based thin-film solar cell whose light-absorbing material is not lost due to patterning, while being capable of solar power generation in the entire area of the solar cell despite the patterning is realized, it is possible to manufacture a high value-added solar cell which not only secures an aesthetic element but also is excellent in terms of price, output power, and stability.

However, most studies conducted so far on the thin-film solar cell have been focused only on an increase in photoelectric conversion efficiency, so that there is an urgent need for the advent of a solar cell which is manufactured at a low price, may be stably used for a long period of time, and may produce a high output power while displaying an aesthetic element.

DISCLOSURE

Technical Problem

The present invention has been contrived to solve the aforementioned problems, and a technical problem to be solved by the present invention is to provide a method for preparing a compound thin film in which a specific pattern can be formed on the surface thereof by using a photoelectrochemical deposition method.

Another technical problem to be solved by the present invention is to provide, by using a photoelectrochemical deposition method, a compound thin film in which a difference in the thickness between a region which is irradiated with light and a region which is not irradiated with light in the thin film occurs, forming a specific pattern on the surface thereof.

Still another technical problem to be solved by the present invention is to provide a compound thin-film solar cell in which a solar cell precursor material is not lost in the process of preparing a thin film having a surface pattern caused by a difference in the thickness, and solar power can be generated in the entire area of the thin-film solar cell in spite of the patterning.

Yet another technical problem to be solved by the present invention is to provide a compound thin-film solar cell which solves the problem of composition inhomogeneity on the surface of the compound thin film, which may be generated by photo-electrodeposition, and has a high added value due to having a color realized on the surface pattern while having a homogeneous composition in the entire area of the light-absorbing layer.

Still yet another technical problem to be solved by the present invention is to provide a compound thin-film solar cell having a surface to which design elements are added, which may be applied to a building's outer walls and windows, automotive glass and chassis, mobile electronic devices, and the like.

Technical Solution

In order to solve the technical problems, an exemplary embodiment of the present invention provides a method for preparing a compound thin film, the method including: an electrolyte solution preparation step of preparing an electrolyte solution by mixing a predetermined precursor with a solvent, a circuit configuration step of configuring an electrodeposition circuit by connecting an electrochemical cell including the electrolyte solution, a working electrode, and a counter electrode to a voltage or current supply device, and a thin film production step of producing a compound thin film having a specific pattern provided on a surface thereof according to a difference in the thickness of the thin film between a region where light arrives and a region where light does not arrive by applying a reduction voltage or current to the working electrode and performing photo-electrodeposition-based patterning with a light source to emit light toward a light blocking means.

An exemplary embodiment of the present invention may further include a color layer formation step of using a compound thin film produced through the thin film production step as a working electrode and forming a color layer on the compound thin film by using a photo-electrodeposition method.

An exemplary embodiment of the present invention may further include a heat treatment step of subjecting a compound thin film produced through the thin film production step to heat treatment under a gas atmosphere including sulfur or selenium.

In an exemplary embodiment of the present invention, a wavelength of the incident light may be shorter than a wavelength corresponding to a bandgap of a compound thin film produced through the thin film production step.

In an exemplary embodiment of the present invention, the light blocking means may be formed as a photomask.

In an exemplary embodiment of the present invention, the light blocking means may further include an anti-reflection film formed on a back surface of the photomask.

In an exemplary embodiment of the present invention, the electrolyte solution may further include a supporting electrolyte and a complexing agent.

In an exemplary embodiment of the present invention, the precursor may be a chloride, sulfate, nitrate, acetate, or hydroxide of one selected from the group consisting of metals such as indium, gallium, tin, zinc, and aluminum, and an alloy of two or more of the metals; or $SeO_2$, $H_2SeO_3$, or $SeCl_4$.

In an exemplary embodiment of the present invention, the electrolyte solution may include a precursor of Cu, In, and Se, and an atomic ratio of Cu, In, and Se may be 0.8~1.2: 1~5:1.8~2.2.

In an exemplary embodiment of the present invention, the complexing agent may be one selected from the group consisting of triethanolamine, citric acid, tartaric acid, sulfamic acid, sodium citrate, potassium hydrogen phthalate, and potassium thiocyanate, or a mixture of two or more thereof.

Further, in order to solve the technical problems, another exemplary embodiment of the present invention provides a compound thin film prepared according to the above-described method for preparing the compound thin film.

In addition, in order to solve the technical problems, still another exemplary embodiment of the present invention provides a solar cell including the above-described compound thin film.

Advantageous Effects

According to the present invention, a compound thin film being formed by photo-electrodeposition can be irradiated with light having an energy larger than that of a bandgap of the thin film to produce extra electron-hole pairs in the thin film, and accordingly, additional thin film deposition other than deposition through an externally applied electric field can be carried out, and finally, a thicker thin film can be prepared under the same electric field strength conditions for the same period of time.

Further, according to the present invention, with the use of a photomask having a pattern to be realized so as to block some regions of a compound thin film from being irradiated with light, it is possible to generate a difference in the thickness between a region which is irradiated with light and a region where light is blocked, and accordingly, a pattern can be formed on the surface of the compound thin film.

In addition, according to the present invention, even though a specific pattern is formed on the surface of a compound thin film, a material for a solar cell light-absorbing layer is not lost at all, the material utilization efficiency can be increased, and accordingly, it is possible to reduce the manufacturing costs of a compound thin-film solar cell including the prepared compound thin film.

Furthermore, according to the present invention, a compound thin-film solar cell including a thin film with a specific pattern provided on the surface thereof can perform solar power generation in the entire area of the solar cell in spite of patterning of the thin film and enables a high output power solar cell with improved aesthetics characteristics.

Further, according to the present invention, it is possible to produce a compound thin-film solar cell having a homogeneous composition in the entire area and having a color by selectively depositing a color layer onto a compound thin film through additional photo-electrodeposition to solve the problem of composition inhomogeneity on the surface thereof, which may be generated by photo-electrodeposition of the compound thin film, thereby providing a high value-added solar cell.

As described above, since the compound thin-film solar cell having a surface pattern according to the present invention consists of inorganic compounds while having effects of an aesthetically pleasing appearance, a low price, and high output power, the compound thin-film solar cell is also excellent in stability and can be applied to a building's outer walls, a building's windows, automotive glass, automotive chassis, mobile electronic devices, and the like, and thus can create a high added value.

In addition, since the compound thin-film solar cell having a surface pattern according to the present invention has a simple method of controlling a surface morphology of a light-absorbing layer, the productivity during the preparation thereof can be improved, and a rigorous multi-step process control is not needed.

Meanwhile, according to the present invention, a preparation time for a compound thin film having a specific thickness can be shortened and a high-quality compound thin film having a dense microstructure and a flat and homogeneous surface can be prepared, and simultaneously, the composition of the compound thin film can be controlled by adjusting the wavelength and intensity of light, and as a result, it is possible to prepare a thin film with a copper-deficient composition essential for a highly efficient CIS-based solar cell.

In addition, according to the present invention, since an expensive vacuum equipment is not used, a process of preparing a compound thin film can be implemented with low costs, and furthermore, it is possible to provide a method for preparing a compound thin film, which can be utilized even for the preparation of all semiconductor thin films capable of forming electron-hole pairs by absorbing light, a compound thin film having a surface pattern, which is prepared therefrom, and a compound thin-film solar cell including the thin film.

MODES OF THE INVENTION

Figure 1:
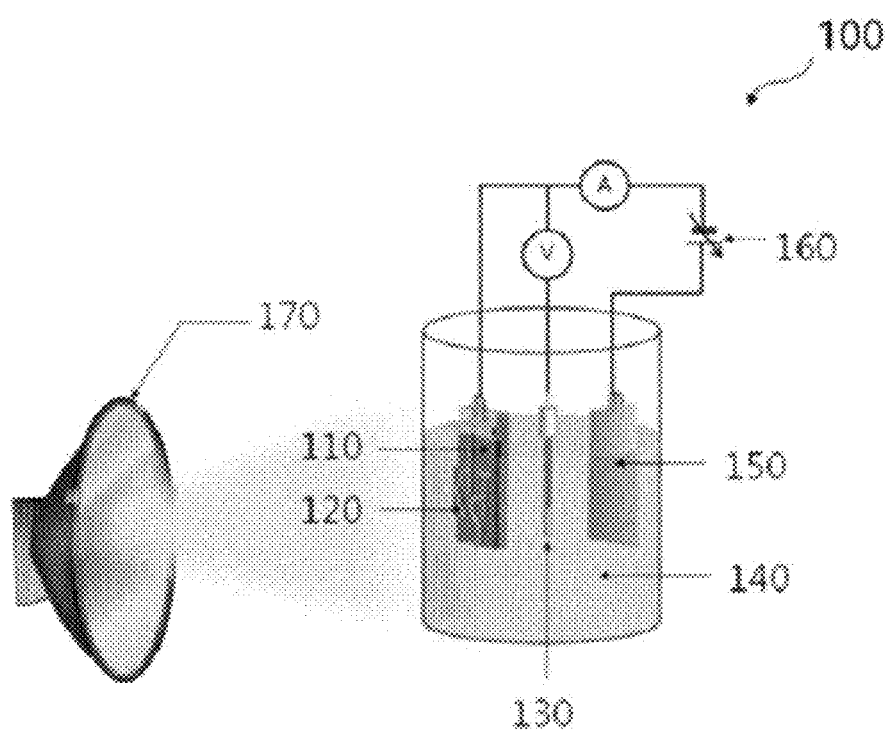
FIG. 1 is a schematic view of an electrochemical cell for preparing a compound thin film having a surface pattern according to an exemplary embodiment of the present invention.

Hereinafter, the present invention will be described with reference to the accompanying drawings. However, the present invention can be implemented in various different forms and is not limited to the embodiments described herein. Further, the accompanying drawings are provided to easily understand the embodiments disclosed in the present specification, and it is to be appreciated that the technical spirit disclosed in the present specification is not limited by the accompanying drawings, and the accompanying drawings include all the modifications, equivalents, and substitutions included in the spirit and the technical scope of the present invention. Furthermore, in order to clearly describe the present invention in the drawings, parts which are not related to the description are omitted, the size, form, and shape of each constituent element illustrated in the drawings may be variously modified, and throughout the specification, the same/similar reference numerals are given to the same/similar parts.

Throughout the specification, when a part is described as being "connected (joined, contacting, conjugated, or bonded)" to another part, this includes not only a case where they are "directly connected (joined, contacting, conjugated, or bonded)" to each other, but also a case where they are "indirectly connected (joined, contacting, conjugated, or bonded)" to each other with another member interposed therebetween. Further, when a part "includes (incorporates or contains)" one constituent element, unless otherwise specifically described, this does not mean that another constituent element is excluded, rather this means that another constituent element may be further included (incorporated or contained).

The terms used in the present specification are used only to describe specific embodiments and are not intended to limit the present invention. Singular expressions include plural expressions unless the context dictates otherwise. In the present specification, the term "include" or "have" is intended to indicate the presence of a stated characteristic, number, step, operation, constituent element, part or combination thereof, and it should be understood that the presence or addition of one or more other characteristics or numbers, steps, operations, constituent elements, parts or combinations thereof is not precluded.

The present invention is, in a method for preparing a CIS-based thin film used as a light-absorbing layer of a thin-film solar cell by using an electrodeposition method, an invention which is intended to accelerate a metal deposition rate on the surface of the thin film by irradiating the CIS-based thin film growing by electrodeposition with light to generate electrons from the CIS-based thin film. In this case, effects such as shortening the time for preparing a thin film, improving the surface flatness and density of the thin film, preparing a thin film with a copper-deficient composition, and implementing an inexpensive preparation process were achieved by adjusting the intensity and wavelength of light to accelerate the electrochemical reaction. Accordingly, when a typical electrochemical deposition method (electrochemical deposition or electrodeposition) in the related art is referred to as ED, the electrodeposition method of the present invention, which accelerates the electrochemical reaction through light irradiation, wherein the acceleration of the electrochemical reaction is further promoted by an increase in the thickness of the thin film, may be defined as self-accelerated photoelectrochemical deposition or self-accelerated photo-assisted electrochemical deposition referred to as SAPED (hereinafter, referred to as "photo-electrodeposition method").

Further, the compound thin film described in the present invention may be a compound-based thin film (CIS-based thin film) typified by copper indium selenide ($CuInSe_2$, CIS), copper indium gallium selenide ($Cu(In_{1-x}Ga_x)Se_2$, CIGS), or copper zinc tin sulfide ($Cu_2ZnSnS_4$, CZTS).

Figure 2:
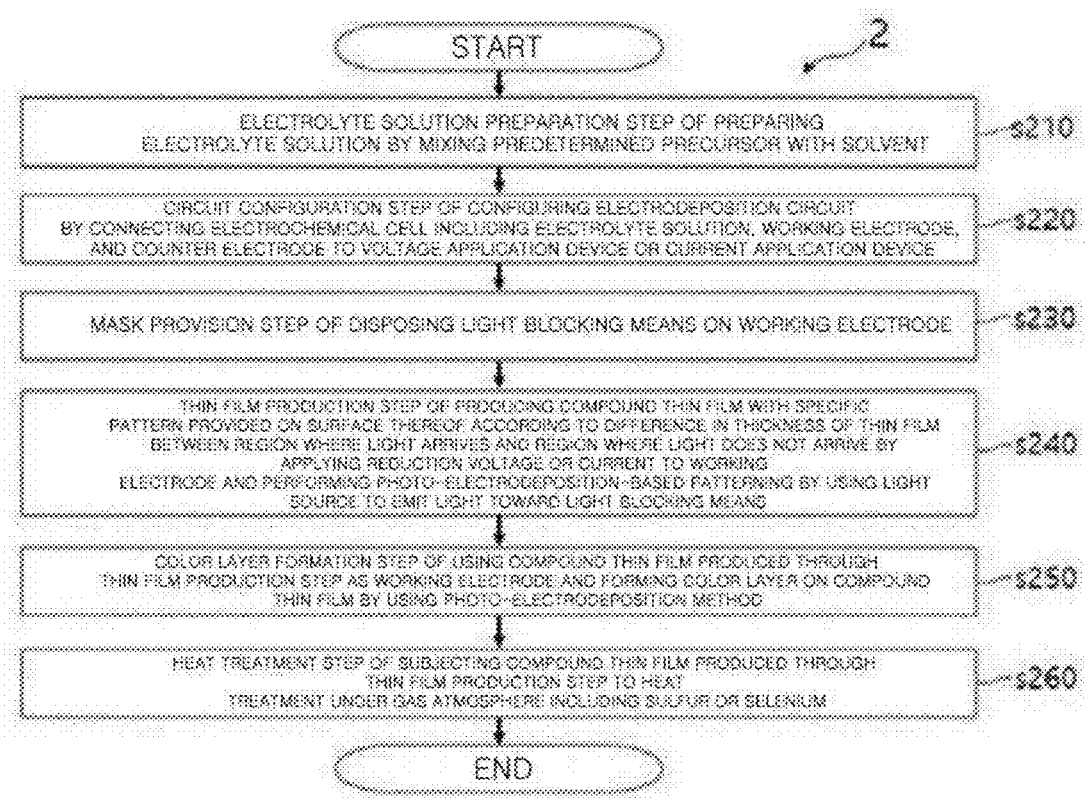
FIG. 2 is a flowchart illustrating a procedure of a method for preparing a compound thin film having a surface pattern according to an exemplary embodiment of the present invention.

FIG. 1 is a schematic view of an electrochemical cell for preparing a compound thin film having a surface pattern (hereinafter, referred to as "compound thin film") according to an exemplary embodiment of the present invention, FIG. 2 is a flowchart illustrating a procedure of a method for preparing a compound thin film having a surface pattern (hereinafter, referred to as "method for preparing a compound thin film 2") according to an exemplary embodiment of the present invention, and hereinafter, referring to FIGS. 1 and 2, the method for preparing a compound thin film 2 and a compound thin film prepared thereby will be described in detail.

The method for preparing a compound thin film 2 includes an electrolyte solution preparation step (s210) of preparing an electrolyte solution by mixing a predetermined precursor with a solvent, a circuit configuration step (s220) of configuring an electrodeposition circuit by connecting an electrochemical cell including the electrolyte solution, a working electrode 110, and a counter electrode to a voltage or current supply device 160, a mask provision step (s230) of disposing a light blocking means 120 on the working electrode 110, and a thin film production step (s240) of producing a compound thin film with a specific pattern provided on a surface thereof according to the difference in the thickness of the thin film between a region where light provided by a light source 170 arrives and a region where light provided by the light source 170 does not arrive by applying a reduction voltage or current to the working electrode 110 and performing photo-electrodeposition-based patterning with the light source 170 to emit light toward the light blocking means 120.

Further, the method for preparing a compound thin film 2 may further include a color layer formation step (s250) of using a compound thin film produced through the thin film production step (s240) as a working electrode 110 and forming a color layer on the compound thin film by using a photo-electrodeposition method and a heat treatment step (s260) of subjecting a compound thin film produced through the thin film production step (s240) to heat treatment under a gas atmosphere including sulfur or selenium.

As described above, in the method for preparing a compound thin film 2, the electrolyte solution preparation step (s210) is carried out as a first step. The electrolyte 140 solution includes a precursor of elements constituting a CIS-based compound, a solvent, and additives such as other counterion supply sources and a complexing agent.

The precursor may be a chloride, sulfate, nitrate, acetate, or hydroxide of a metal such as indium (In), gallium (Ga), tin (Sn), zinc (Zn), and aluminum (Al); a chloride, sulfate, nitrate, acetate, or hydroxide of an alloy of two or more of In, Ga, Sn, Zn, and Al; or a non-metal precursor such as selenium oxide ($SeO_2$), selenious acid ($H_2SeO_3$), or selenium chloride ($SeCl_4$), but the precursor used in various exemplary embodiments of the present invention may be used without limitation as long as the precursor is a material or compound which can be electro-deposited by an electrodeposition method and form a CIS-based thin film.

Further, when a precursor of copper (Cu), indium (In), and selenium (Se) is used as the precursor, an atomic ratio of Cu, In, and Se included in the electrolyte 140 solution including the precursor may be 0.8~1.2:1~5:1.8~2.2. For example, the above-described atomic ratio may be 1:4:2. When a precursor composition is constituted so as to satisfy the composition ratio, it is possible to prepare a compound thin film which has superior light absorption efficiency and is excellent in flatness, density, and the like.

In addition, the electrolyte solution preparation step (s210) prepares an electrolyte solution by mixing the above-described predetermined precursor with a suitable solvent, and in this case, as a usable solvent, a solvent having an electrical conductivity suitable for performing an electrodeposition method while can dissolve the precursor may be used without limitation. For example, the solvent used in the electrolyte solution preparation step (s210) may be water, alcohol, or a mixture of water and an alcohol.

Furthermore, the pH of an electrolyte solution prepared by mixing the precursor with the solvent through the electrolyte solution preparation step (s210) may be maintained within a range of 1.5 to 3. This is because when the pH of the electrolyte 140 solution is less than 1.5 or more than 3, it is difficult to prepare a homogeneous thin film, and a problem such as the precipitation of platy CuSe or the like may also occur. However, the pH is not necessarily limited to the pH value.

The electrolyte 140 solution may further include a supporting electrolyte and a complexing agent as an additive in addition to the precursor and the solvent. The supporting electrolyte is for increasing the electrical conductivity of the electrolyte solution and may be formed of a material such as, for example, potassium chloride (KCl) or lithium chloride (LiCl). Further, the complexing agent is a material for adjusting the mobility of specific ions in the electrolyte solution, and it is possible to use, for example, one selected from the group consisting of triethanolamine ($N(CH_2CH_3)_3$), citric acid ($C_6H_8O_7$), tartaric acid ($C_4H_6O_6$), sulfamic acid ($NH_2SO_3H$), sodium citrate ($Na_3C_6H_5O_7$), potassium hydrogen phthalate ($C_8H_5KO_4$), and potassium thiocyanate (KSCN), or a mixture of two or more thereof, but the complexing agent is not limited thereto.

In the method for preparing a compound thin film 2, a circuit configuration step (s220) is carried out after the electrolyte 140 solution preparation step (s210).

Referring to FIG. 1, an electrochemical cell 100 according to an exemplary embodiment of the present invention may include a working electrode 110, a light blocking means 120, a reference electrode 130, an electrolyte 140 solution, a counter electrode 150, a voltage or current supply device 160, and a light source 170.

An electrodeposition circuit using the electrochemical cell 100 may be configured by filling the inside of an electrolytic bath with an electrolyte 140 solution and providing a substrate, a working electrode 110, a counter electrode 150, a reference electrode 130, and the like, and further includes separately a light source 170 for providing light in addition to the above, that is, an illumination lamp.

The electrolytic bath may allow light to readily pass through by using a transparent material such as quartz or glass. Further, the substrate is an object onto which a CIS-based compound, which is a light-absorbing layer, is electro-deposited, and may be a substrate including molybdenum. In general, the substrate including molybdenum is excellent in electrical conductivity and relatively inexpensive, has a thermal expansion coefficient similar to that of the CIS-based compound which is a light-absorbing layer, and also has excellent contact resistance (ohmic contact).

Meanwhile, as the substrate, a metal substrate may be used, and when a metal substrate is used, the metal substrate may not include molybdenum, and in this case, a material for the substrate is not particularly limited.

For the counter electrode 150 and the reference electrode 130, an electrode formed of a material commonly used in an electrodeposition method may be used, and aspects such as the size and form thereof may be variously configured without any particular limitation. For example, as the counter electrode 150, a platinum (Pt) electrode or the like may be used, and when a molybdenum substrate is used as a substrate onto which a CIS-based compound is electro-deposited and a platinum electrode is used as the counter electrode 150, the configuration scheme of an electrodeposition circuit is "(−) Mo|CIS [0050]|electrolyte|Pt(+)".

While a compound thin film is growing through electrodeposition, one closed circuit is formed as i) a flow of electrons or holes in an Mo substrate and a compound thin film (CIS), ii) a reduction reaction of positive ions at the CIS/electrolyte interface, iii) a diffusion of ions in the electrolyte, and iv) an oxidation reaction of negative ions in the counter electrode (Pt) sequentially occur in the electrodeposition circuit. In this case, the thickness t of the compound thin film formed through electrodeposition is proportional to an amount of charge supplied to the electrodeposition circuit as in the following Equation 1.

$$t = \frac{\int I \cdot dt_{ED}}{nF} \cdot \frac{M}{A\rho}$$ ⟨Equation 1⟩

In Equation 1, I, $t_{ED}$, n, F, M, A, and p respectively denote the current flowing in the electrodeposition circuit, the time taken for electrodeposition, the sum of charge numbers of ions constituting a compound (n=13 in CIS), the Faraday constant, the molecular weight of a compound, the area of the thin film, and the density of the thin film.

The current flowing under a given voltage is proportional to the reaction rate in steps i) to iv), and when one of the reactions is relatively slower than the others, the overall reaction rate is limited by the slowest reaction step. Accordingly, in various exemplary embodiments of the present invention, it is possible to obtain effects of accelerating the overall reaction by using light as a catalyst of the total reaction including steps i) to iv) and allowing emitted light to accelerate the slowest reaction among steps i) to iv).

Finally, a light source 170 or an illumination lamp for emitting light is essential as a constituent element of an electrodeposition circuit for achieving a unique effect of the present invention. The illumination should be able to irradiate all areas of the substrate, and when the emitted light has a wavelength smaller than a wavelength corresponding to a bandgap of a compound semiconductor produced by electrodeposition, various illumination lamps may be used without particular limitation in the size, form, type thereof, and the like.

In the method for preparing a compound thin film 2, a mask provision step (s230) of disposing a light blocking means 120 on a working electrode 110 is carried out as a step subsequent to the circuit configuration step (s220).

The light blocking means 120 may be formed as a photomask. Further, the light blocking means 120 may further include an anti-reflection film formed on a back surface of the photomask.

The method for preparing a compound thin film 2 is intended to provide a compound thin film with a desired pattern realized on the surface thereof by a difference in the thickness between a region which is irradiated with light and a region which is not irradiated with light by preparing a compound semiconductor thin film through photoelectrochemical deposition while disposing a light blocking means 120 with a pattern to be realized on the surface of the thin film on a working electrode 110.

In the method for preparing a compound thin film 2, a surface pattern corresponding to the shape of a light blocking means 120 is displayed by a difference in the thin film growth thickness between a region which is irradiated with light (a region where light arrives) and a region in which light is blocked by a photomask (a region where light does not arrive) (a phenomenon of inducing the difference in thickness) during the growth of the thin film by photo-electrodeposition. Accordingly, a specific pattern may be patterned on the surface of a compound thin film prepared through the method for preparing a compound thin film by variously modifying the form of the light blocking means 120.

For example, when the light blocking means is a photomask, the photomask may be used without limitation as long as the photomask is formed of a material which is chemically stable in the electrolyte 140 solution. Further, as described above, an anti-reflection film may be provided on the back surface of the photomask in order to clearly induce a difference in the thickness of a compound thin film caused by the blocking of light.

That is, by a photo-electrodeposition performed in various exemplary embodiments of the present invention, a thin film which is thicker than that prepared by the electrodeposition method in the related art may be prepared under the conditions of the same electric field strength and the same time period.

When light emitted on some regions of a substrate is blocked by a photomask with a pattern to be realized by using the phenomenon of inducing the difference in thickness a difference in thickness of a thin film formed between a region where light arrives and a region where light does not arrive occurs, so that a pattern may be formed on the surface of the compound thin film.

In the method for preparing a compound thin film 2, as a step subsequent to the mask provision step (s230), a thin film production step (s240) in which a compound thin film with a specific pattern provided on the surface thereof is produced according to the difference in the thickness between a region where light arrives and a region where light does not arrive is carried out by applying a reduction voltage or current to a working electrode 110 and performing photo-electrodeposition-based patterning with a light source 170 to emit light toward a light blocking means 120.

The thin film production step (s240) through application of current and light irradiation may be carried out under the conditions of, for example, normal temperature and normal pressure, that is, a temperature of 0 to 80° C. and a pressure of 0.9 to 1.1 atm, and the voltage for supplying current (application of current by DC voltage) may be a voltage within a range of −0.4 V to −0.6 V (for example, −0.5 V), but is not limited thereto. Further, the voltage application time may be 1 to 130 minutes. In addition, a process of applying a reduction voltage or current to a working electrode by using a voltage or current supply device 160 and a process of emitting light toward a light blocking means by using a light source 170 may be simultaneously carried out.

Meanwhile, as described above, as a light source for light irradiation during the electrodeposition process performed in the s240 step, it is possible to use a light source having a wavelength smaller than a wavelength corresponding to the bandgap of a compound semiconductor manufactured by electrodeposition (for example, when $CuInSe_2$ having a bandgap of 1.04 eV is electro-deposited, a light source having a wavelength smaller than 1190 nm). This is for allowing the semiconductor to absorb light and produce electron-hole pairs.

In the method for preparing a compound thin film 2, it is possible to further carry out a color layer formation step (s250) of using a compound thin film produced through the thin film production step (s240) as a working electrode 110 and forming a color layer on the compound thin film by using a photo-electrodeposition method in addition to the above-described steps s210 to s240.

The color layer formed through the color layer formation step (s250) may be a layer formed of CuSe.

When an additional color layer is formed on a compound thin film with a specific pattern provided, which is prepared through the thin film production step (s240) by using a photo-electrodeposition method, and accordingly, a solar cell including the prepared compound thin film is produced, it is possible to realize a solar cell in which a pattern and a color are both imparted to the surface of the light-absorbing layer while maintaining a high material utilization rate. Accordingly, it is possible to further enhance the aesthetic characteristics of a solar cell and solve the problem of composition inhomogeneity which may be inevitably generated by photo-electrodeposition patterning.

Figure 11:
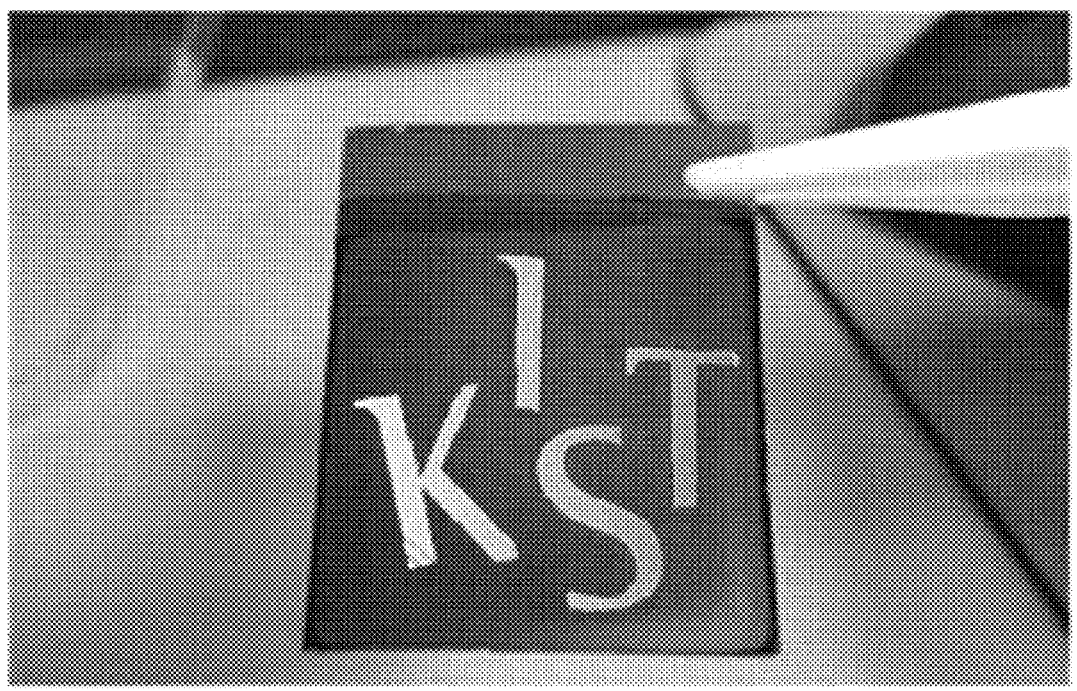
FIG. 11 is a view illustrating a photograph in which an additional color layer is formed on a compound thin film with a specific pattern provided thereon according to an exemplary embodiment of the present invention.

When a solar cell exhibiting a surface pattern has color as in FIG. 11, which is a photograph illustrating a compound thin film with a specific pattern and an additional color layer provided thereon, the added value of the solar cell may be certainly further increased.

Further, in the method for preparing a compound thin film 2, it is possible to further carry out a heat treatment step (s260) of subjecting a compound thin film produced through the thin film production step (s240) after the thin film production step (s240) or the color layer formation step (s250) to heat treatment under a gas atmosphere including sulfur or selenium.

The heat treatment step (s260) is a process for the densification of a microstructure through the phase formation or crystal grain growth of the electro-deposited compound thin film, and in this case, the heat treatment temperature may be 300° C. to 700° C. This is because when the heat treatment temperature is less than 300° C., the grain growth may not be sufficiently achieved, and when the heat treatment temperature is more than 700° C., a problem in that glass, which is a material for a substrate, is bent may occur. For example, the heat treatment temperature may be 500° C. to 550° C.

As an example, in the heat treatment step (s260), a heat treatment process may also be carried out under a selenide atmosphere in order to prevent selenium (Se) components in the electro-deposited compound thin film from being vaporized. Further, a bandgap of a light absorbing CIS layer having a bandgap of 1.04 eV may be increased by substituting a part or all of selenium with sulfur (S) through the heat treatment step (s260), and in order to achieve an increase in efficiency according to an increase in $V_{oc}$ caused by the increase in bandgap, the heat treatment in the heat treatment step (s260) may be carried out under a sulfur (S) atmosphere.

By the heat treatment process, gas-phase selenium or sulfur may react with molybdenum to form molybdenum diselenide ($MoSe_2$) or molybdenum disulfide ($MoS_2$), and molybdenum diselenide or molybdenum disulfide having an appropriate thickness may increase adhesion and result in excellent contact resistance (ohmic contact). For example, the appropriate thickness may be set to 50 to 150 nm, but is not necessarily limited thereto.

In addition, as another example, in the heat treatment step (s260), gas-phase selenium or sulfur react with molybdenum to excessively increase the thickness of molybdenum diselenide or molybdenum disulfide, thereby increasing series resistance, and as a result, a drop in solar cell efficiency may be caused. However, these issues may be overcome by appropriately adjusting the vapor pressure of selenium or sulfur. The above-described adjustment of vapor pressure may vary according to the form of selenium or sulfur. When selenium or sulfur in a solid or powder form is used, the vapor pressure may be adjusted by controlling the temperature of selenium or sulfur while maintaining a set target temperature of a substrate on which a CIS-based thin film is electro-deposited. Furthermore, when selenium or sulfur in a gas form (for example, hydrogen selenide ($H_2Se$), hydrogen sulfide ($H_2S$), or the like) is used, the thickness of molybdenum diselenide or molybdenum disulfide may be controlled by adjusting the partial pressure of the gas.

In various exemplary embodiments of the present invention, a CIS-based thin film finally prepared by the method for preparing a compound thin film 2 may have the following composition:

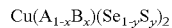

$$Cu(A_{1-x}B_x)(Se_{1-y}S_y)_2$$

Here, A and B are each independently one element selected from the group consisting of In, Ga, Zn, Sn, and Al, and 0≤x, y≤1.

Accordingly, specific examples of the CIS-based thin film include a copper-indium-selenium (CIS) thin film, a copper-indium-gallium-selenium (CIGS) thin film, a copper-zinc-tin-sulfur (CZTS) thin film, and the like, and as described above, a compound thin film prepared by the method for preparing a compound thin film 2 may be the CIS-based thin film.

That is, various exemplary embodiments of the present invention may provide a CIS-based thin film or compound thin film prepared by the above-described self-accelerated photoelectrochemical deposition method, the CIS-based thin film or compound thin film may be used as a high-efficiency and high-quality light absorbing thin film because the microstructure thereof is dense and the surface thereof is flat and homogenous, and the CIS-based thin film or compound thin film may be particularly a thin film having a copper-deficient composition essential for a high-efficiency CIS-based solar cell. Further, various exemplary embodiments of the present invention may also provide a thin-film solar cell using the high-quality thin film as a light-absorbing layer.

Hereinafter, the present invention will be described in more detail through Examples, and the following Examples are provided to help understanding of the present invention, and are not intended to limit the scope of the present invention.

EXAMPLES

In order to form a CIS-based thin film which is one type of a compound thin film according to various exemplary embodiments of the present invention, a three-electrode electrochemical deposition method was used. A PARSTAT MC manufactured by AMETEK, Inc. was used as a potentiostat, and soda lime glass on which molybdenum was deposited with a thickness of 500 nm, a silver-silver chloride electrode (Ag/AgCl), and a platinum substrate (Pt sheet) were used as a working electrode, a reference electrode, and a counter electrode, respectively.

A solution for electrodeposition was prepared by dissolving potassium chloride, copper (II) chloride dihydrate, indium chloride, selenium dioxide, sulfamic acid, and potassium hydrogen phthalate in 60 ml of deionized (DI) water to a concentration of 0.24 mM, 2.4 mM, 9.6 mM, 5.2 mM, 12 mM, and 12 mM, respectively.

In order to realize a surface pattern on the CIS-based thin film, electrochemical deposition was performed with a photomask formed of an ST304 material being disposed on a molybdenum working electrode while emitting light of about 25 mW/cm$^2$ toward the working electrode. In this case, a plasma lighting system (PLS) electroless lamp was used as a light source, the electrodeposition was carried out by a chronoamperometric method, and a CIS-based thin film was formed by applying a voltage of −0.54 V for 5,400 seconds.

Figure 3:
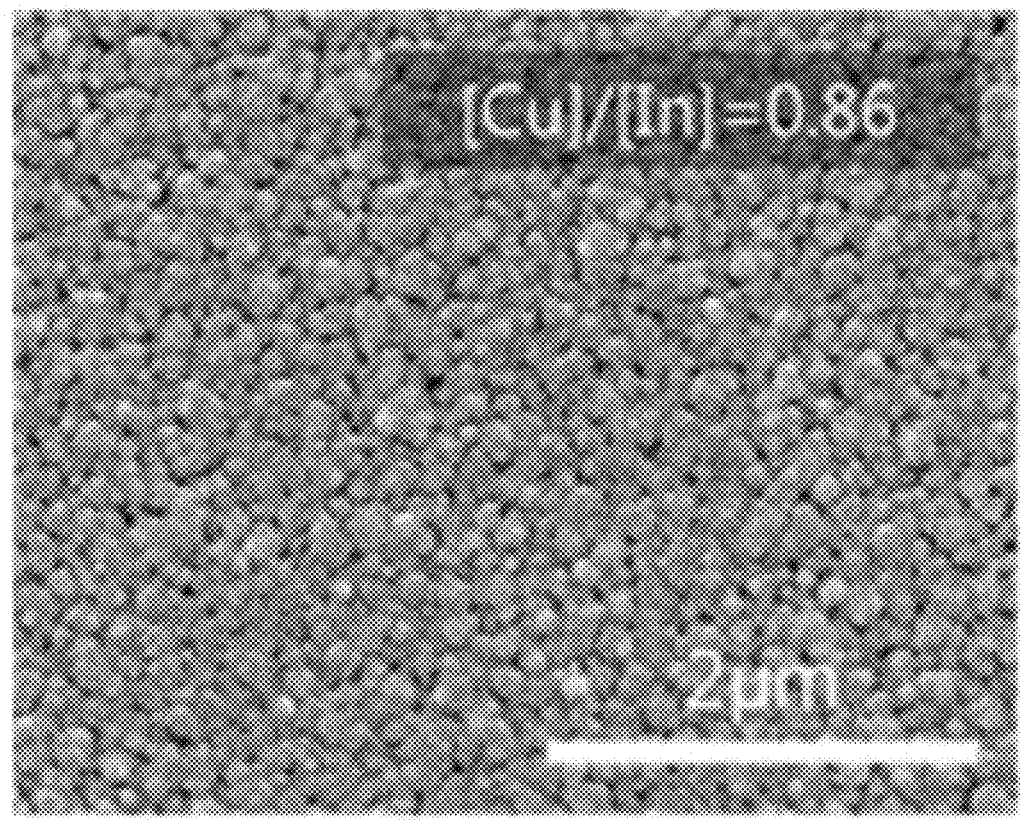
FIGS. 3 and 4 are respectively SEM images for a surface and a cross-section of a compound thin film prepared by applying a constant voltage of −0.54 V for 5,400 seconds under a condition of light irradiation at about 25 mW/cm$^2$ using a plasma lighting system (PLS) as a light source, according to an exemplary embodiment of the present invention.
Figure 4:
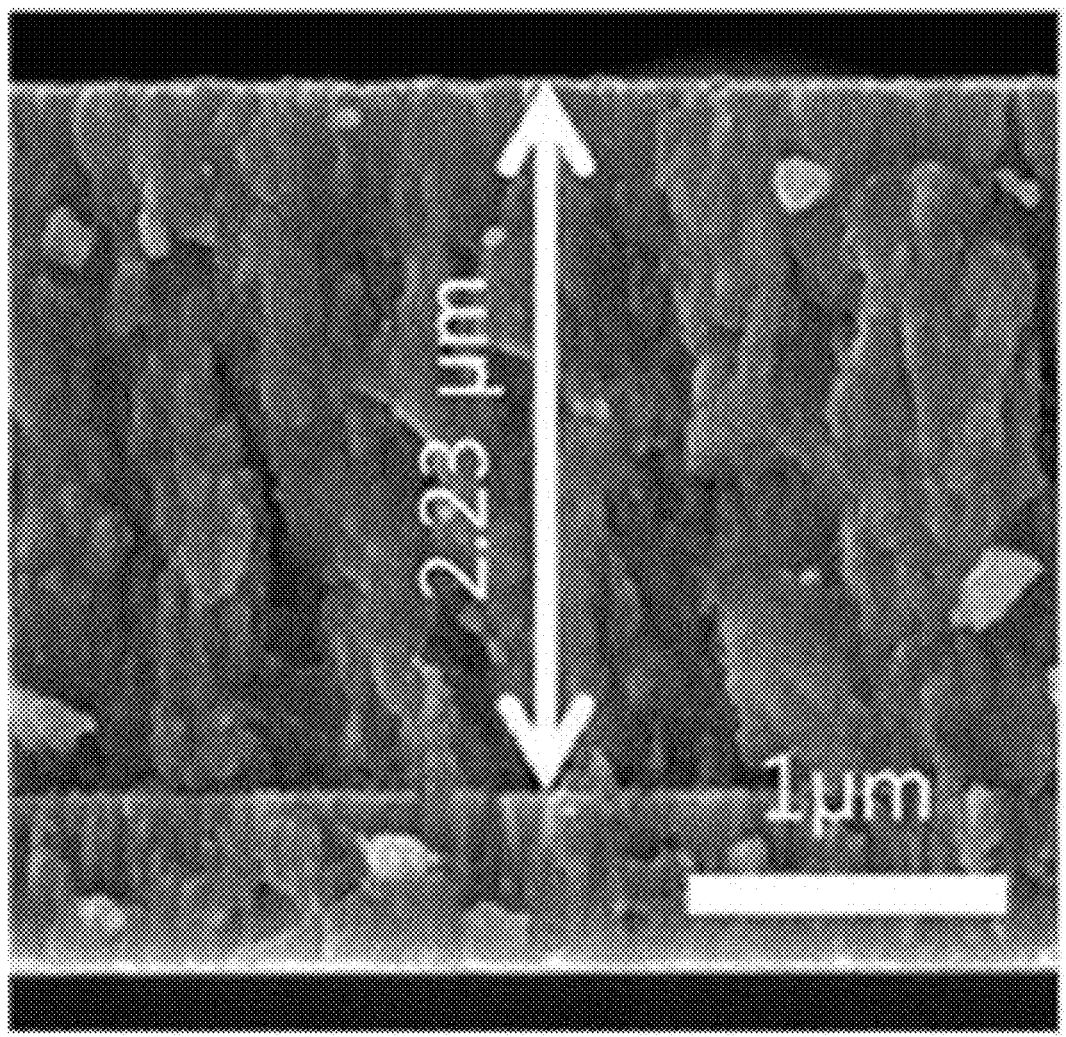
Figure 6:
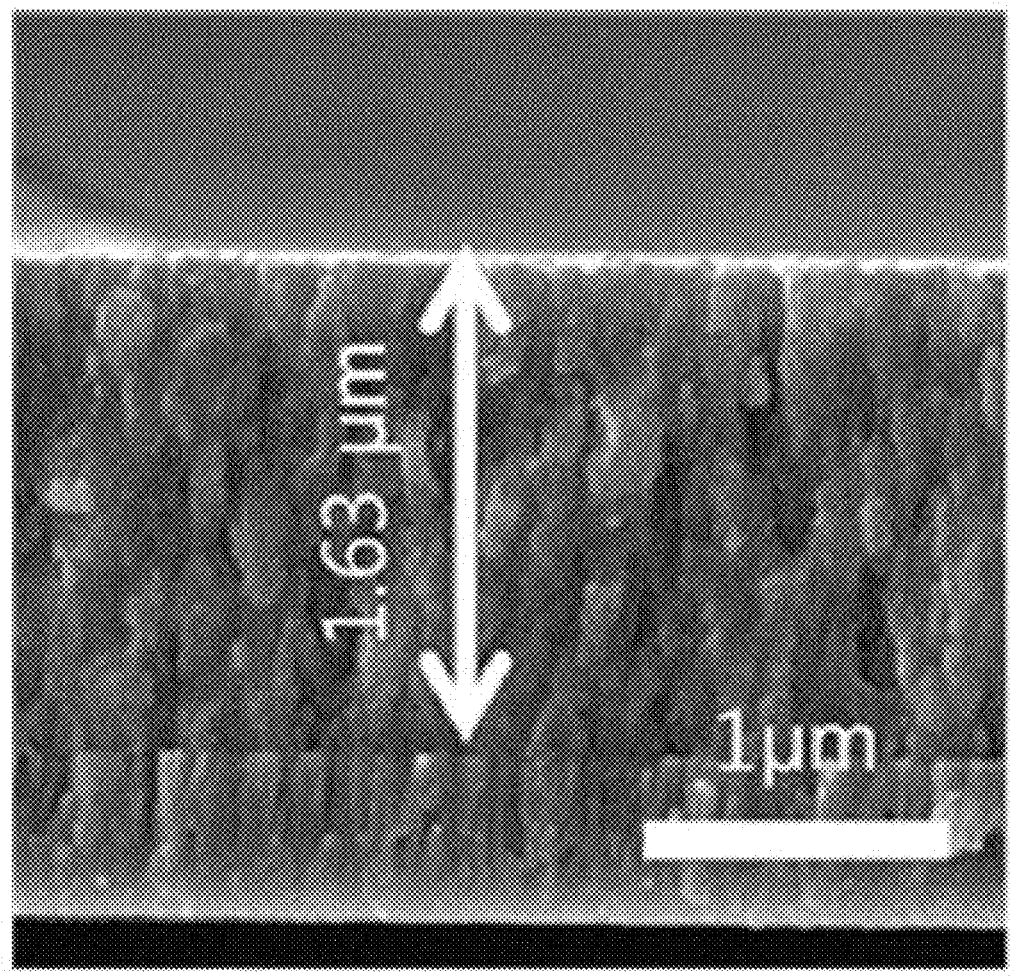

In order to observe surface and cross-sectional morphologies of the photo electro-deposited CIS-based thin film which was irradiated with light, a scanning electron microscope (FE-SEM, Inspect F50) was used, and the results are illustrated in FIGS. 3 and 4. Referring to FIG. 3, it can be seen that when the thin film was irradiated with light, the surface density was increased, and referring to FIG. 4, it can be seen that the thickness of the thin film prepared by photo-electrodeposition was about 2.23 μm, which is about 1.4 times thicker than the thickness in the Comparative Example to be described below (FIG. 6).

Figure 7:
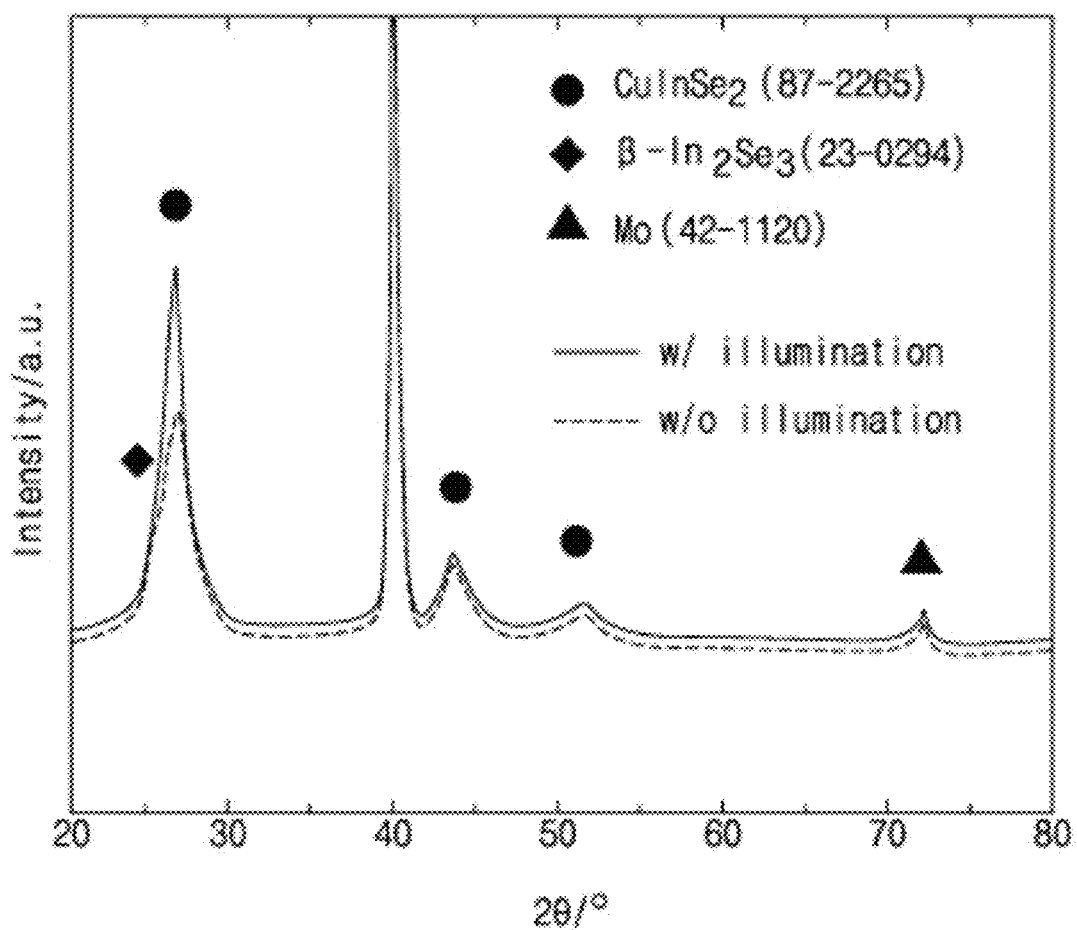
FIG. 7 is a graph illustrating XRD patterns of compound thin films prepared in a light irradiation condition and a non-light irradiation condition, according to an exemplary embodiment of the present invention.

In addition, in order to investigate the composition and crystal structure of the formed CIS-based thin film, an energy dispersive X-ray spectroscopy (EDS, FEI, Inspect F50) analysis and an X-ray diffraction (XRD) analysis were performed, and the results are illustrated in FIGS. 3 and 7, respectively.

Referring to FIG. 3, it can be seen that since the ratio of [Cu]/[In] was 0.86, a copper-deficient composition which is a necessary condition for the high efficiency of a CIS-based solar cell is satisfied, and referring to FIG. 7, it can be seen that the CIS-based thin film prepared by the photo-electrodeposition does not include a secondary phase except for the α-CuInSe$_2$ crystal phase.

Figure 8:
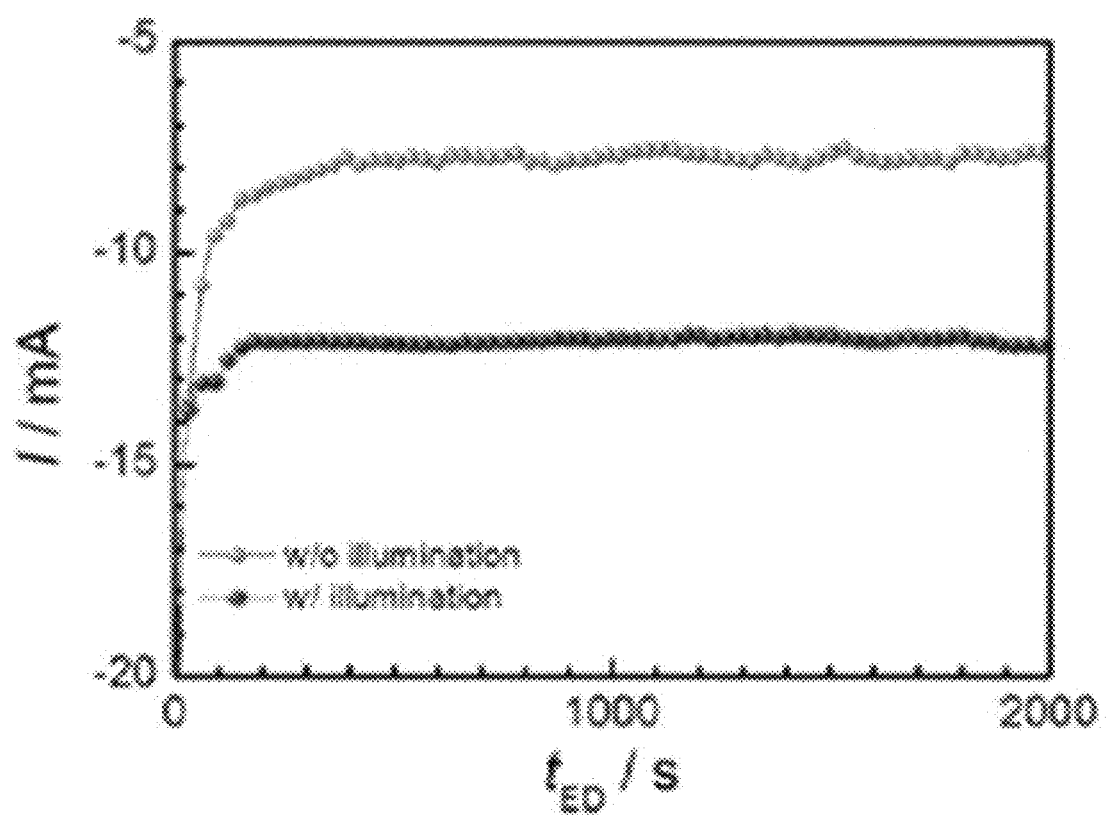
FIG. 8 is a graph illustrating a change in electrodeposition current in the case of light irradiation and the case of non-light irradiation, according to an exemplary embodiment of the present invention.

Meanwhile, referring to the current-time graph of the case of light irradiation and the case of non-light irradiation illustrated in FIG. 8, it can be seen that the electrodeposition current was increased by light irradiation, and the electrochemical reaction rate can be controlled by adjusting the intensity of light.

Figure 9:
FIG. 9 is a view illustrating an example of a pattern provided on a surface of a compound thin film prepared through photo-electrodeposition by photomask attachment and light irradiation according to an exemplary embodiment of the present invention.

A photograph of the surface pattern of a CIS-based compound thin film realized according to various exemplary embodiments of the present invention is illustrated in FIG. 9.

As a result of providing a photomask on a molybdenum working electrode to block light on a partial region of the substrate, it can be confirmed that the surface of the CIS-based thin film was patterned due to the occurrence of a difference in the thickness of the thin film between a region which was exposed to light and a region which was not exposed to light.

Figure 10:
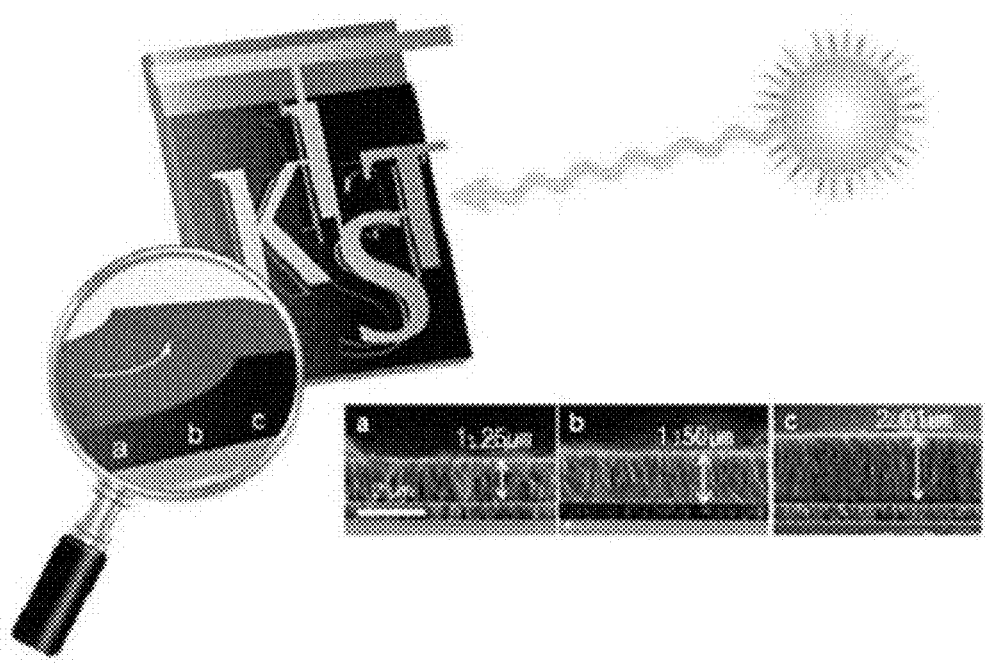
FIG. 10 is a scanning electron microscope image of a compound thin film prepared through photo-electrodeposition by photomask attachment and light irradiation according to an exemplary embodiment of the present invention.

According to various exemplary embodiments of the present invention, a cross-sectional photograph of the CIS thin film prepared by photo-electrodeposition while a photomask is attached is illustrated in FIG. 10. Referring to FIG. 10, it can be confirmed that the difference in thickness of the thin film between a region which was irradiated with light (a region where light arrived) and a region in which light was blocked by the photomask (a region where light did not arrive) was approximately 0.76 μm. Further, it can be confirmed that solar power generation could be performed in all the regions of the thin film without a non-active region (dead area) in which a light-absorbing layer was not formed.

As observed above, through various exemplary embodiments of the present invention, it is possible to provide a compound-based thin-film solar cell capable of performing solar power generation in the entire area of the solar cell without a non-active region while having aesthetic characteristics due to a pattern realized on the surface of the thin-film solar cell using a photoelectrochemical deposition. In addition, through various exemplary embodiments of the present invention, it can be seen that it is possible to prepare a CIS-based thin-film solar cell having a copper-deficient composition required for a high-efficiency CIS-based solar cell while maximizing an inherently high material utilization efficiency in the electrodeposition method.

Meanwhile, when a CIS-based thin film is prepared by attaching a photomask and performing light irradiation as described above, surface composition inhomogeneity of the light-absorbing layer results from a difference in copper-indium composition ratio between a region which is exposed to light and a region which is not exposed to light due to the photomask.

For the purpose of complementing the composition inhomogeneity, an additional process of making the copper-indium composition ratio in the entire photoactive region homogeneous was carried out by additionally depositing a CuSe layer corresponding to the color layer by a photoelectrochemical method, according to various exemplary embodiments of the present invention.

That is, during deposition of the CuSe layer, the CuSe layer was stably formed in a region which was irradiated with light, and the CuSe layer deposited on a region which was not irradiated with light was allowed to be removed from the surface after the deposition process of the CuSe layer by adjusting adhesion with the substrate. Finally, a low copper-indium composition ratio of the CIS-based thin film formed in a region which was irradiated with light became similar to the composition ratio in a region which was not irradiated with light through the photo-electrodeposition of an additional CuSe layer.

A solution for photo-electrodeposition of a CuSe layer was prepared by dissolving copper sulfate pentahydrate and selenium dioxide in 60 ml of DI to a concentration of 10 mM and 20 mM, respectively. The structure of an electrochemical cell for photo-electrodeposition of a CuSe layer is the same as that described in the photo-electrodeposition of the CIS-based thin film except that a CIS-based thin film prepared by the previously described photo-electrodeposition method was used as a working electrode.

After a photomask of the same type as that used in the photo-electrodeposition of the CIS-based thin film was well arranged so as to be disposed at a position that precisely coincides with a surface pattern realized on a working electrode, a CuSe layer was formed by performing light irradiation using the same light source and applying −0.49 V for 600 seconds, and the result is illustrated in FIG. 11. Referring to FIG. 11, it can be observed that during deposition of the CuSe layer, a noticeable violet CuSe layer was formed in a region which was irradiated with light, whereas in a region which was not irradiated with light, deposited CuSe particles were mostly removed after the process due to poor adhesion with the substrate.

According to the present invention as described above, it can be seen that when a CIS-based solar cell is manufactured, aesthetic characteristics of the solar cell may be further reinforced by realizing both a pattern and a color on the surface of the light-absorbing layer while maintaining a high material utilization efficiency, and composition inhomogeneity, which inevitably results due to photo-electrodeposition patterning, may be remedied by using additional photo-electrodeposition.

COMPARATIVE EXAMPLE

A CIS-based thin film was formed by the same electrodeposition method using an electrolyte solution prepared using the same method as in the above-described Example, but electrodeposition was performed under a non-light irradiation condition.

Figure 5:
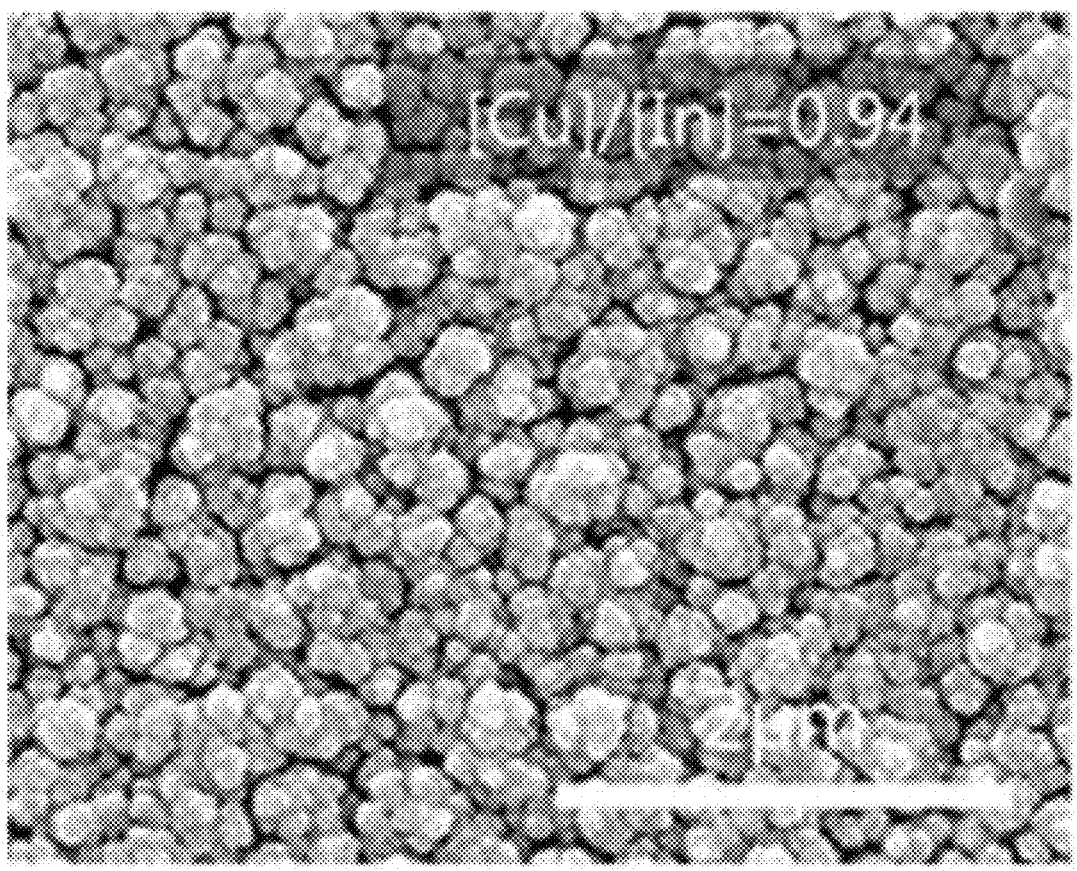
FIGS. 5 and 6 are respectively SEM images for a surface and a cross-section of a compound thin film prepared by applying a constant voltage of −0.54 V for 5,400 seconds in a non-light irradiation condition in the related art.

The surface and cross-sectional morphologies of the CIS-based thin film prepared according to the Comparative Example were observed using the same method as in the above-described Example, and the results are illustrated in FIGS. 5 and 6.

Referring to FIG. 5, it can be seen that when compared with FIG. 3 which is a photograph of the surface of the thin film according to the Example, a plurality of pores were formed in the surface of the thin film. Further, according to FIG. 6, the thickness of the thin film prepared according to the Comparative Example was 1.63 μm, and a thin film having a smaller thickness than that of the thin film prepared according to the above-described Example was formed. Accordingly, it can be seen that the compound thin film prepared by various exemplary embodiments of the present invention exhibited a higher density, had a very flat surface, and was deposited at a faster rate.

Meanwhile, as a result of observing the composition of the CIS-based thin film prepared according to the Comparative Example using the same method as in the above-described Example, as illustrated in FIG. 6, although it was confirmed that the [Cu]/[In] ratio was 0.94, which still classifies as a copper-deficient composition, the [Cu]/[In] composition ratio was slightly high for the CIS-based thin film to be applied to a high-efficiency solar cell. As described above, it is confirmed that the CIS-based thin film, which is a type of compound thin film prepared according to various exemplary embodiments of the present invention, satisfies a copper-deficient composition within a range suitable for a high-efficiency CIS-based solar cell, and it is possible to prepare a thin film which is about 1.4-fold thicker during electron-deposition for the same time period because the reduction reaction of In ions is accelerated by light.

Through various exemplary embodiments, the present invention described so far may provide a compound thin film with a desired pattern realized on the surface thereof by a difference in the thickness between a region which is irradiated with light and a region which is not irradiated with light in the thin film by preparing a compound semiconductor thin film by photoelectrochemical deposition while disposing a light blocking means or photomask having a pattern to be realized on the surface of the thin film by using a phenomenon in which the thin film growth rate becomes fast when the compound semiconductor thin film is irradiated with light during electrodeposition of the thin film, in order to solve the above-described problems of the conventional technology.

Further, through various exemplary embodiments, the present invention may provide a high value-added compound thin-film solar cell having a homogeneous composition in the entire area of a light-absorbing layer and a colored surface pattern by solving the problem of surface composition inhomogeneity of the compound thin film, which may be generated by photo-electrodeposition, and realizing a color on the surface pattern.

In addition, through various exemplary embodiments of the present invention, when a compound semiconductor thin film formed by electrodeposition is irradiated with light having an energy larger than the bandgap of the thin film, extra electron-hole pairs are produced in the thin film, so that additional thin film deposition may be carried out in addition to the deposition induced by an externally applied electric field.

That is, according to the photo-electrodeposition (photo-electrochemical deposition), a thicker thin film may be prepared by the electrodeposition for the same time period under the same electric field conditions. When light emitted on some regions of a substrate is blocked by a photomask with a pattern to be realized using the phenomenon, a difference in the thickness of a thin film formed between a region which is irradiated with light and a region where light is blocked occurs, so that a pattern may be provided on the surface of the compound thin film.

When a compound thin-film solar cell having a surface pattern according to various exemplary embodiments of the present invention is manufactured, there is no loss of a material for the solar cell light-absorbing layer due to the patterning of the thin film, so that the manufacturing costs of the thin-film solar cell may be reduced by maximizing the material utilization efficiency.

In addition, the compound thin-film solar cell having a surface pattern according to various exemplary embodiments of the present invention is capable of performing solar power generation in the entire area of the solar cell in spite of patterning of the thin film, thereby providing an aesthetically pleasing solar cell with high output power.

As described above, since the compound thin-film solar cell having a surface pattern according to various exemplary embodiments of the present invention consists of inorganic compounds while being characterized by an aesthetically pleasing appearance, a low price, and high output power, the compound thin-film solar cell is also excellent in stability, so that it is possible to provide a high value added solar cell which can be applied to a building's outer walls and windows, automotive glass and chassis, mobile electronic devices, and the like.

Further, a method for controlling the surface morphology of a light-absorbing layer for manufacturing a compound thin-film solar cell having a surface pattern according to various exemplary embodiments of the present invention is relatively simple, and thus has advantages in that the productivity during the preparation process may be improved, and a rigorous multi-step process control is not needed.

Meanwhile, according to various exemplary embodiments of the present invention, a preparation time for a compound thin film having a specific thickness may be shortened and a high-quality compound thin film having a dense microstructure and a flat and homogeneous surface may be prepared, and simultaneously, the composition of the compound thin film may be controlled by adjusting the wavelength and intensity of light, and as a result, it is possible to prepare a thin film with a copper-deficient composition essential for a highly efficient CIS-based solar cell, and a process of preparing a compound thin film may be realized with low costs because an expensive vacuum apparatus is not used, and furthermore, it is possible to provide a method for preparing a compound thin film, which may be utilized even for the preparation of all semiconductor thin films capable of forming electron-hole pairs by absorbing light, a compound thin film having a surface pattern, which is prepared therefrom, and a compound thin-film solar cell including the thin film.

The above-described description of the present invention is provided for illustrative purposes, and a person skilled in the art to which the present invention pertains will understand that the present invention can be easily modified into other specific forms without changing the technical spirit or essential features of the present invention. Therefore, it should be understood that the above-described embodiments are illustrative in all aspects and are not restrictive. For example, each constituent element which is described as a singular form may be implemented in a distributed form, and similarly, constituent elements which are described as being distributed may be implemented in a combined form. The scope of the present invention is represented by the claims to be described below, and it should be interpreted that the meaning and scope of the claims and all changes or modified forms derived from the equivalent concepts thereof fall within the scope of the present invention.

DESCRIPTION OF REFERENCE NUMERALS

110: Working electrode
120: Light blocking means
130: Reference electrode
140: Electrolyte
150: Counter electrode
160: Voltage or current supply device
170: Light source

What is claimed is:

1. A method for preparing a film of a CIS semiconductor compound overcoated by a color layer by photo-electrodeposition, comprising:
   (a) preparing an electrolyte solution by mixing precursors of film constituents including Cu, In, and Se with a solvent;
   (b) configuring an electrodeposition circuit by connecting an electrochemical cell comprising the electrolyte solution, a working electrode, and a counter electrode to a voltage or current supply device;
   (c) disposing a photomask having a predetermined pattern on the working electrode;
   (d) producing the film through the photomask in the predetermined pattern on a surface of the working electrode according to a difference in thickness of the film between a region where light arrives and a region where light does not arrive, by:
      (i) applying a reduction voltage or current to the working electrode on which the photomask is disposed;
      (ii) disposing a light source to emit light toward the photomask; and
      (iii) photoelectrically depositing the film of the CIS semiconductor compound on the surface of the working electrode at least in the predetermined pattern by reducing the precursors while illuminating the light source through the photomask;
   (e) subjecting the film to heat treatment under a gas atmosphere comprised of sulfur or selenium; and
   (f) forming the color layer consisting essentially of CuSe at least in the predetermined pattern on the film of the CIS semiconductor compound, after heat treatment, with the film employed as a working electrode using photo-electrodeposition.

2. The method of claim 1, wherein the film has a bandgap having a corresponding wavelength, and wherein light emitted by the light source has a wavelength that is shorter than the corresponding wavelength of the bandgap of the compound film.

3. The method of claim 1, wherein the photomask has a backside surface having an anti-reflection film formed thereon.

4. The method of claim 1, wherein the electrolyte solution further comprises a supporting electrolyte and a complexing agent.

5. The method of claim 1, wherein the predetermined precursor is a chloride, a sulfate, a nitrate, an acetate, or a hydroxide of a material selected from the group consisting of indium, gallium, tin, zinc, aluminum, and an alloy of two or more thereof; or $SeO_2$, $H_2SeO_3$, or $SeCl_4$.

6. The method of claim 1, wherein the electrolyte solution has an atomic ratio of Cu:In:Se that is 0.8~1.2:1~5:1.8~2.2.

7. The method of claim 4, wherein the complexing agent is selected from the group consisting of triethanolamine, citric acid, tartaric acid, sulfamic acid, sodium citrate, potassium hydrogen phthalate, potassium thiocyanate, and a mixture of two or more thereof.

8. The method of claim 2, wherein the light source has an intensity of light that is adjustable, and wherein the method further comprises controlling copper content of the CIS semiconductor compound by varying the wavelength and the intensity of the light so that photoelectrical deposition of the film provides a CIS semiconductor compound that is copper-deficient.

* * * * *